United States Patent [19]
Furutani

[11] Patent Number: 5,786,719
[45] Date of Patent: Jul. 28, 1998

[54] MODE SETTING CIRCUIT AND MODE SETTING APPARATUS USED TO SELECT A PARTICULAR SEMICONDUCTOR FUNCTION

[75] Inventor: Kiyohiro Furutani, Kyogo, Japan

[73] Assignee: Mitsubishi Denki Kabushiki Kaisha, Tokyo, Japan

[21] Appl. No.: 732,096

[22] Filed: Oct. 15, 1996

Related U.S. Application Data

[63] Continuation of Ser. No. 524,951, Sep. 8, 1995, abandoned.

[30] Foreign Application Priority Data

Mar. 6, 1995 [JP] Japan ................ 7-045236

[51] Int. Cl.$^6$ ................ H03K 3/289
[52] U.S. Cl. ................ 327/202; 327/142; 327/198; 327/18
[58] Field of Search ................ 327/202, 203, 327/143, 142, 57, 198, 18, 379, 157, 538; 365/233

[56] References Cited

U.S. PATENT DOCUMENTS

| | | | |
|---|---|---|---|
| 3,812,384 | 5/1974 | Skorup | 327/203 |
| 4,484,087 | 11/1984 | Mazin et al. | 327/203 |
| 4,560,889 | 12/1985 | Hayashi | 327/143 |
| 4,833,650 | 5/1989 | Hirayama et al. | 365/225.7 |
| 4,959,618 | 9/1990 | Shier | 328/155 |
| 5,280,203 | 1/1994 | Hung et al. | 327/202 |
| 5,406,134 | 4/1995 | Menut | 327/202 |
| 5,444,402 | 8/1995 | MaMahon et al. | 327/379 |
| 5,546,031 | 8/1996 | Seesink | 327/155 |
| 5,576,651 | 11/1996 | Phillips | 327/203 |

FOREIGN PATENT DOCUMENTS

| | | |
|---|---|---|
| 60-224326 | 11/1885 | Japan . |
| 60-198920 | 10/1985 | Japan . |
| 4-47711 | 2/1992 | Japan . |
| 4-130514 | 5/1992 | Japan . |

OTHER PUBLICATIONS

Fletcher, An Engineering Approach to Digital Design, 1980, Fig. 5–23.

*Primary Examiner*—Timothy P. Callahan
*Assistant Examiner*—Jung Ho Kim
*Attorney, Agent, or Firm*—Lowe, Price, LeBlanc & Becker

[57] ABSTRACT

A semiconductor apparatus includes a mode setting circuit with reduced power consumption to select one of a plurality of functions produced by the apparatus. The mode setting circuit includes a switching transistor to connect or disconnect a first latch circuit with a mode setting terminal to which a mode setting potential is applied. A reset transistor connected in series with the switching transistor resets the first latch circuit. A control signal such as a clock signal causes either the switching transistor or the reset transistor to conduct alternately. The control signal and the input and output signals of the first latch circuit are fed to the following stage that include another latch circuit to generate a mode setting signal. The mode setting signal is determined based on whether or not the mode setting terminal is connected to the mode setting potential.

26 Claims, 6 Drawing Sheets

MODE SETTING CIRCUIT AND MODE SETTING APPARATUS USED TO SELECT A PARTICULAR SEMICONDUCTOR FUNCTION

This application is a continuation of application Ser. No. 08/524,951 filed Sept. 8, 1995 abandoned.

TECHNICAL FIELD

The present invention relates to a semiconductor apparatus having plural functions, and in particular, to a semiconductor apparatus having a mode setting circuit with reduced power consumption.

BACKGROUND ART

Since semiconductor devices are used in various apparatuses, different specifications are required depending on their intended uses. However, development and manufacture of semiconductor devices specifically tailored for each intended use are costly and inefficient. In view of this, a semiconductor device having a plurality of functions is manufactured with a mode setting circuit. The circuit is used to select the function of the semiconductor depending on its intended use prior to being shipped to a user.

Figure 10:
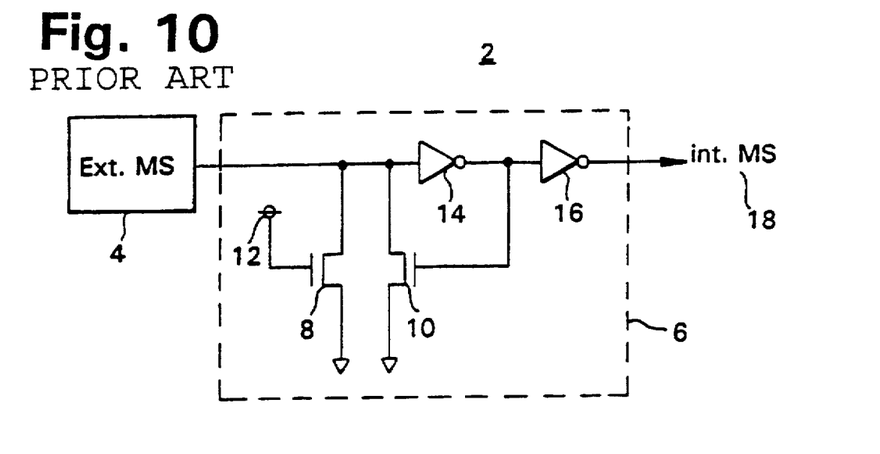
FIG. 10 illustrates a circuit diagram of a mode setting circuit of the related art.

FIG. 10 illustrates a mode setting circuit 2 disclosed in an Unexamined Japanese Patent Publication No. 3-214669. The mode setting circuit 2 includes a mode setting terminal 4, e.g., a bonding pad, and a function select signal generating circuit 6 to generate an internal mode select (int. MS) signal 18. The function select signal generating circuit 6 includes two n-channel metal oxide semiconductor field effect transistors (MOSFETs) 8 and 10 connected in parallel, and two inverter circuits 14 and 16 connected in series.

The drains of the n-channel MOSFETs 8 and 10 are connected to the bonding pad 4 supplying an external mode select (Ext. MS) signal, while the sources thereof are connected to a reference potential, e.g., ground potential. The gate of the n-channel MOSFET 8 is connected to a supply potential Vcc 12, and the gate of the n-channel MOSFET 10 is connected to an output of the inverter circuit 14. The inverter circuit 16 outputs the int. MS signal 18, which is an output signal of the mode setting circuit 2.

Figure 11:
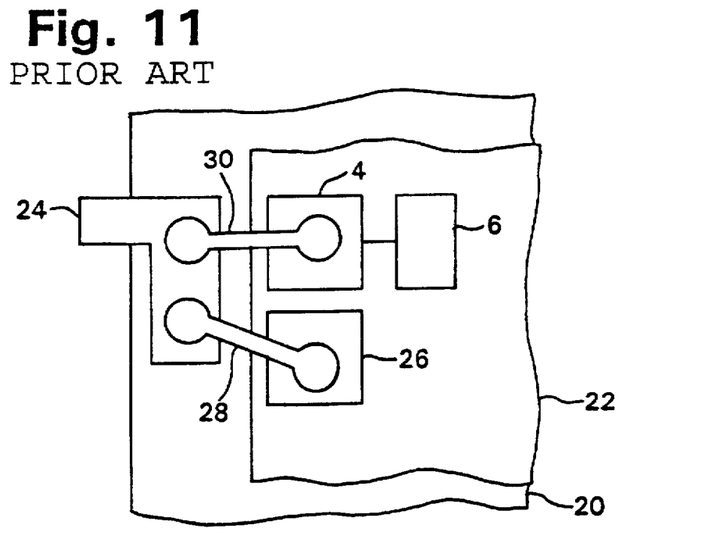
FIG. 11 shows a partial structure of a semiconductor mode setting apparatus of the related art.

FIG. 11 illustrates a partial structure of an apparatus including the mode setting circuit 2. A package 20 accommodates therein a semiconductor device 22 and a power supply potential Vcc pin 24. The semiconductor device 22 includes the mode setting terminal 4, a function select signal generating circuit 6 and a power supply potential Vcc terminal 26. Metal wires 28 and 30 connect the power supply potential Vcc pin 24 to the power supply potential Vcc terminal 26 and the mode setting terminal 4. As a result, the supply potential Vcc pin 24 and the supply potential Vcc terminal 26 have equivalent potentials.

Although not shown in FIG. 10, the n-channel MOSFET 8 of the function select signal generating circuit 6 has a large channel length for a large electrical resistance between the source and drain. A current flowing between the source and the drain is small even when the supply potential Vcc 12 is applied to the gate of the n-channel MOSFET 8 such that the MOSFET 8 is in a conductive state. Hence, the influences on subsequent stages due to a voltage drop are small.

The supply potential Vcc, i.e., a high potential, supplied from the supply potential Vcc pin 24 is inputted to the sources of the n-channel MOSFETs 8 and 10 and to the inverter circuit 14. The inverter circuit 14 outputs an inverted input to the inverter circuit 16 at a subsequent stage. The inverter circuit 16 outputs the int. MS signal 18 having a "HH" potential as the output of the mode setting circuit 2. However, due to the steady-state current flowing from the source of the n-channel MOSFET 8 to the grounded drain, power consumption cannot be avoided.

If the bonding pad 4 of the semiconductor device 22 is not connected to the supply potential Vcc pin 24 of the package 20, i.e., the bonding pad 4 is floating, the n-channel MOSFET 8 determines the input potential to the inverter circuit 14. The n-channel MOSFET 8 is in a conductive state due to the supply potential Vcc 12 applied to the gate so that the drain potential is the same as a potential at the source, e.g., a ground potential. Accordingly, the input potential to the inverter circuit 14 is a low "L" potential such that the int. MS signal 18 outputted via the two inverter circuits is a low "L" potential.

As described above, it is possible to provide two different functions to one semiconductor apparatus depending on whether a given terminal (bonding pad 4) of the semiconductor device 22 is connected to another terminal (supply potential Vcc pin 24) of the package 20 or not. With such a semiconductor device to provide different functions, the cost can be reduced, while satisfying the demands of plural users. However, such a conventional mode setting apparatus is disadvantageous due to the current consumption caused by the current flow through the MOSFET 8 when the bonding pad formed on the semiconductor device is connected to the terminal of the package.

DISCLOSURE OF THE INVENTION

An advantage of the invention is in reducing the power consumption of a mode setting circuit, and an apparatus with such a circuit to select one of the functions of a semiconductor device.

According to the present invention, the foregoing and other advantages are achieved in part by a mode setting circuit comprising a mode setting terminal, a switch circuit, first and second holding circuits and a reset circuit. The switch and reset circuits comprise p-channel and n-channel transistors, respectively, where the drains are coupled to each other. The source of the p-channel transistor receives an external mode setting signal of a high potential or a floating potential depending on whether the mode setting terminal is connected to a voltage potential Vcc pin. The source of the n-channel transistor is coupled to a ground potential. The gates of the transistors are connected to a clock signal which has been inverted by inverters.

The first holding circuit, which is coupled to the drain connection of the p-channel and n-channel transistors, comprises two inverters coupled in parallel, and the input of each inverter receive an output from one another. The second holding circuit comprises a gate means and a latch mean section, each comprising two NAND gates. The gate means receives the output signals of the first holding circuit, and a signal applied to the gates of the transistors which has been inverted by an inverter. One of the NAND gates of the latch means section outputs an internal mode select signal for selecting a function of the semiconductor device.

The potential of the internal mode select signal is determined based on whether or not the mode setting terminal is connected to the supply potential Vcc pin. When the mode setting terminal is connected to the voltage potential Vcc pin and the clock signal is a high potential, the latch means section is set at a holding state. When the mode setting terminal is connected to the voltage potential Vcc pin and the clock signal is a low potential, the internal mode select signal changes to a high potential state, whereas, if the mode setting terminal is not connected, the internal mode select signal is a low potential.

In an alternative embodiment, the external mode select signal is one of a ground potential or a floating potential depending on whether the mode setting terminal is connected to a ground potential Vss pin. The source of the switch circuit comprising a n-channel transistor is connected to the mode setting terminal, and the source of the reset transistor comprising a p-channel transistor is connected to a power supply potential. The gates of the transistor receive clock signals which have been inverted by an inverter. Further, one of the NAND gates of the first holding means receives a signal applied at the gates of the transistors which has been inverted by an inverter.

As in the previous embodiment, the potential of the internal mode select signal is determined based on whether or not the mode setting terminal is connected to the ground potential Vss pin. When the mode setting terminal is connected to the ground potential Vss pin and the clock signal is a high potential, the latch means is in a holding state. When the mode setting terminal is connected to the ground potential Vss pin and the clock signal is a low potential, the internal mode select signal is high potential, whereas, when the mode setting terminal is not connected, the internal mode select signal is a low potential.

Another aspect of the invention is a dummy cycle generating circuit having Vbb level detector, ring oscillator and Vpp or Vbb pumping circuit to generate dummy cycles to stably operate the mode setting circuit. The Vpp level detector detects the application of power to the semiconductor device and outputs an output signal of a high potential ACT to the ring oscillator. The ring oscillator outputs dummy clock signals to be applied to the mode setting circuit until the output signal ACT from the Vpp level detector changes to a low potential in response to the substrate potential or internal increased potential reaches a predetermined potential.

Additional advantages, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements.

BEST MODE OF CARRYING OUT THE INVENTION

Figure 1:
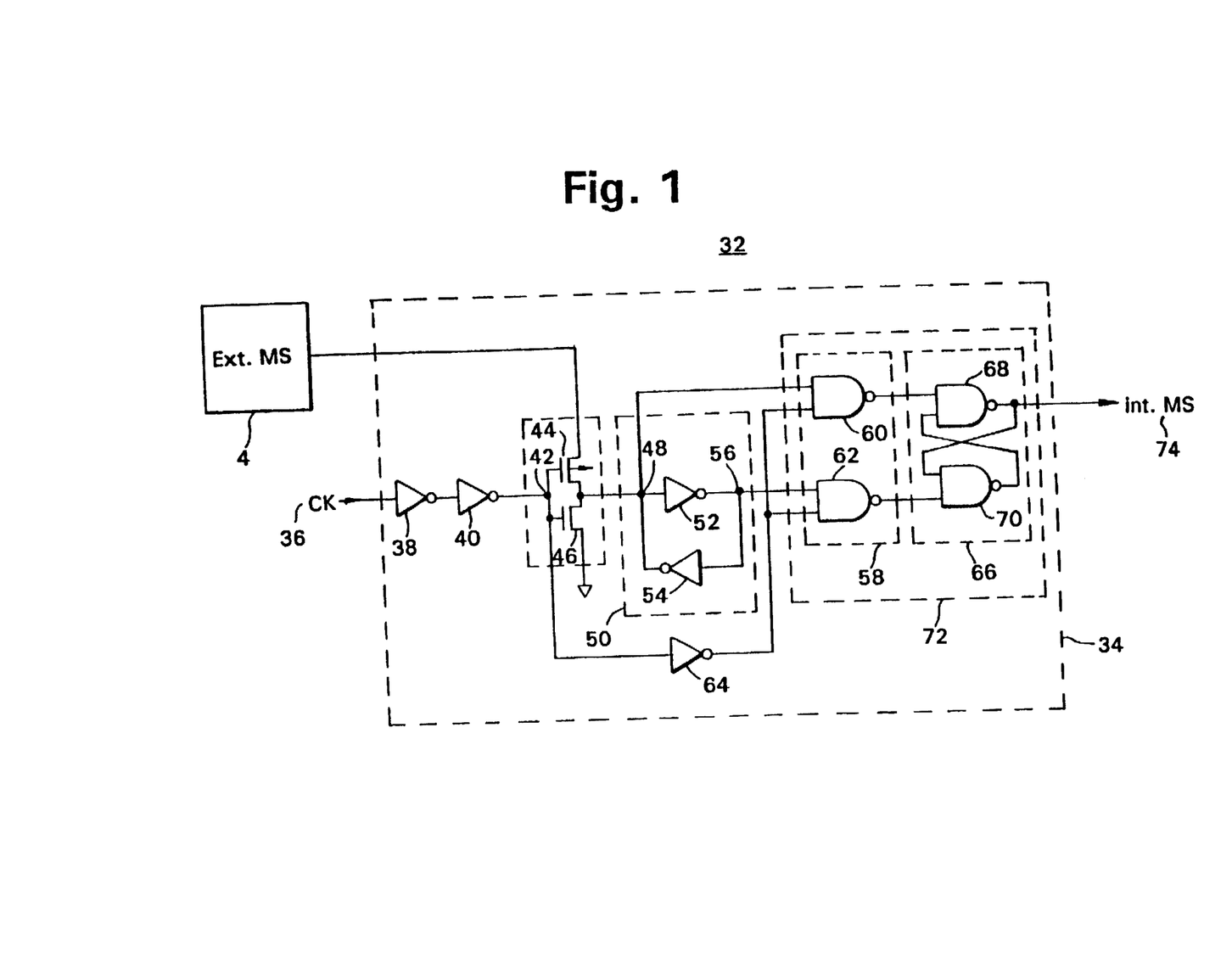
FIG. 1 is a diagram illustration of a mode setting circuit according to one embodiment of the present invention.

FIG. 1 is a circuit diagram of a mode setting circuit 32 in accordance with a first embodiment of the present invention. A mode setting terminal 4, e.g., a bonding pad, supplies an Ext. MS signal to a signal generating circuit 34 which generates an int. MS signal 74 to select a function of a semiconductor apparatus. The circuit 34 includes inverters 38, 40 and 64, switch and reset circuits 44 and 46, and first and second latch circuits 50 and 72.

A clock input signal CK 36 is fed through the inverter circuits 38 and 40 to a controlling terminal 42, e.g., a clock signal input node, coupled to the switching circuit 44, e.g., a gate of a p-channel MOSFET, and to a reset circuit 46, e.g., a gate of a n-channel MOSFET. The source of the n-channel MOSFET 46 is connected to a ground potential, and the source of the p-channel MOSFET 44 is connected to the mode setting terminal 4 receiving the Ext. MS signal. The drains of the p-channel MOSFET 44 and the n-channel MOSFET 46 are connected to each other. The output potential supplied from the drains of the transistors 44 and 46 at a node 48 is inputted to the first latch circuit 50.

The first latch circuit 50 comprises inverter circuits 52 and 54. Subsequently, an output signal from the inverter circuit 52, i.e. the potential at the node 56, is inputted to the inverter circuit 54, and an output signal of the inverter circuit 54, i.e., a potential at the node 48, is inputted to the inverter circuit 52. Thus, the output signal from transistors 44 and 46 is temporarily held in the first latch circuit 50 until there is a change in the input signal to the inverter circuit 52.

The second latch circuit 72 comprises a gate means 58 and a latch means section 66. Both means 58 and 66 include two NAND gates 60, 62 and 68, 70, respectively. The input signal to the first latch circuit 50, i.e., the potential applied to the node 48, is also inputted to the NAND gate 60 of the gate means 58. The NAND gate 60 is also supplied an output signal from the inverter circuit 64 inverting an input signal applied to the switch circuit 44. The input signals to the NAND gate 62 are the output signal from the first latch circuit 50 and the output signal from the inverter 64.

The output signal from the NAND gate 60 is inputted to the NAND gate 68 of the latch means 66. The output signal of the NAND gate 62 is inputted to the NAND gate 70. The output signal of the NAND gate 70 is inputted to the NAND gate 68, and the output signal of the NAND gate 68 is inputted to the NAND gate 70. Thus, the latch means section 66 latches the input signals from the gate means. The output signal from the NAND gate 68 is outputted to a subsequent stage as the output signal, i.e., int. MS signal 72, of the signal generating circuit 34.

As described above, the mode setting circuit of the present invention is incorporated in a semiconductor device, see, e.g., FIG. 11. The functional signal generating circuit 34 replaces the circuit 6 described in the background art. The mode setting terminal 4 formed in the semiconductor device 22 is connected via the metal wire 30 to the supply potential Vcc pin 24 formed in the package 20. The supply potential Vcc pin 24 is connected via the metal wire 28 to the supply potential Vcc terminal 26 in the semiconductor device 22. Accordingly, the terminal 4 works as the supply potential Vcc terminal 26.

Figure 2:
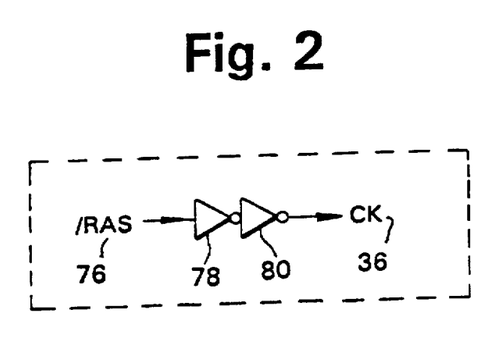
FIG. 2 is a circuit diagram of a clock signal generator for generating clock signals applied to the mode setting circuit.

FIG. 2 illustrates an embodiment of a circuit for generating a clock signal CK inputted into the signal generating circuit 34 illustrated in FIG. 1. The ROW ADDRESS STROBE (/RAS) signal 76 is a signal for activating row addresses when the signal becomes low "L" potential. The /RAS signal 76 is inputted to the inverter circuits 78 and 80 to generate clock input signal CK 36. The inverter circuits 78 and 80 serve as buffers for amplifying the drive capability. The output signal of the clock circuit changes to a high "H" potential when the /RAS signal 76 changes to a high "H" potential, and a low "L" potential when the /RAS signal 76 changes to a low "L" potential.

Figure 3:
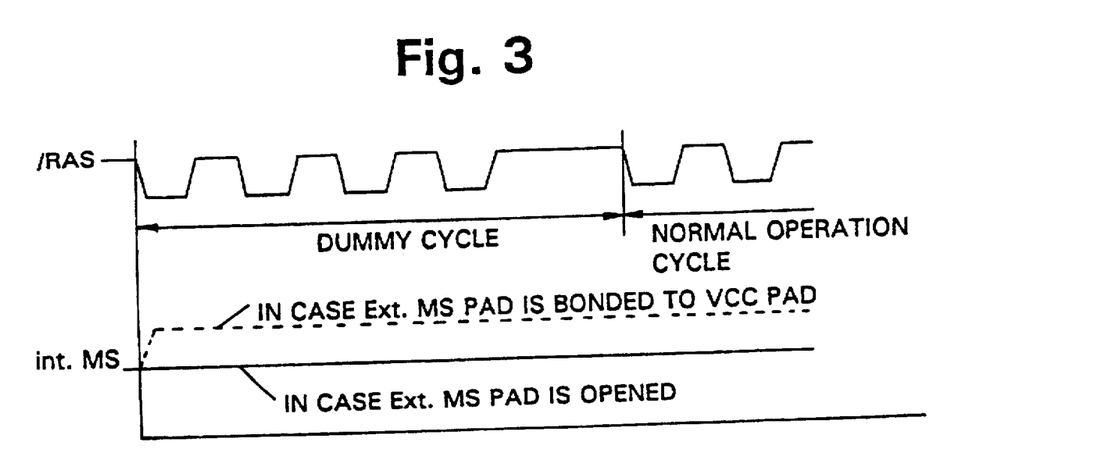
FIG. 3 is a timing chart illustrating the operation of FIG. 1 embodiment with reference to row address strobe (/RAS) signal and internal mode select(int. MS) signal.

FIG. 3 is a timing chart for illustrating the operation of the mode setting circuit 32 of FIG. 1. In the semiconductor device, the /RAS signal is repeatedly changed to a low "L" potential plural times during the dummy cycles before entering the normal operation cycles after the application of the supply potential Vcc. During these dummy cycles, the first latch circuit 50 and the second latch circuit 72 in the function select signal generating circuit 34 are caused to hold a given signal.

When the /RAS signal 31 change to a high "H" potential, inverter circuit 40 outputs a signal of a high "H" potential. Since the n-channel MOSFET 46 becomes conductive, the potential at the node 48 changes to a low "L" potential, and a potential at the node 56 supplying the output signal of the first latch circuit 50 to the subsequent stage changes to a high "H" potential. On the other hand, the output signal of the inverter circuit 64 changes to a low "L" potential. Accordingly, the output signal of the NAND gates 60 and 62 changes to a high "H" potential to cause the latch means 66 to be in a holding state.

When the /RAS signal 31 changes to a low "L" potential, the potential of the int. MS signal 74 differs depending on whether or not the bonding pad 4 is connected to the supply potential Vcc pin 24. The potential of the int. MS signal 74 does not change even during the second and subsequent cycles of the dummy cycles and the normal operation cycles.

If the bonding pad 4 is connected to the supply potential Vcc pin and the /RAS signal 76 is a low "L" potential, the output signal of the inverter circuit 40 changes to a low "L" potential such that the p-channel MOSFET 44 becomes conductive. The potential of the node 48 changes to a high "H" potential, and the potential of the node 56 changes to a low "L" potential. On the other hand, the output signal of the inverter circuit 64 changes to a high "H" potential. The output signal of the NAND gates 60 and 62 of the gate means 58 changes to low "L" and high "H" potentials, respectively, such that the int. MS signal 74 from the latch means 66 (which is the output signal of the mode setting circuit 32) changes to a high "H" potential.

If the bonding pad 4 is not connected to the supply potential Vcc pin and the /RAS signal 76 is a low "L" potential, the output of the inverter circuit 40 changes to a low "L" potential such that the p-channel MOSFET 44 becomes conductive. However, since the mode setting terminal 4 is not connected to the supply potential pin Vcc 24, e.g., a floating condition, the potential at the node 48 changes to a low "L" potential, and the potential at the node 56 changes to a high "H" potential. The output signal of the inverter circuit 64 changes to a high "H" potential. Hence, the output signals of the NAND gates 60 and 62 change to high "H" and low "L" potentials, respectively, such that the int. MS signal 74 becomes a low "L" potential.

When the /RAS signal 76 is a high "H" potential, the latch means 66 is set in a holding state. When the /RAS signal is a low "L" potential, the potential of the int. MS signal 74 is dependent on whether or not the mode setting terminal 4 is connected to the supply potential Vcc pin 24. With such arrangement and operation, a steady-state current does not flow even when the bonding pad 4 is connected to the supply potential Vcc pin 24, and the power consumption is reduced.

Figure 4:
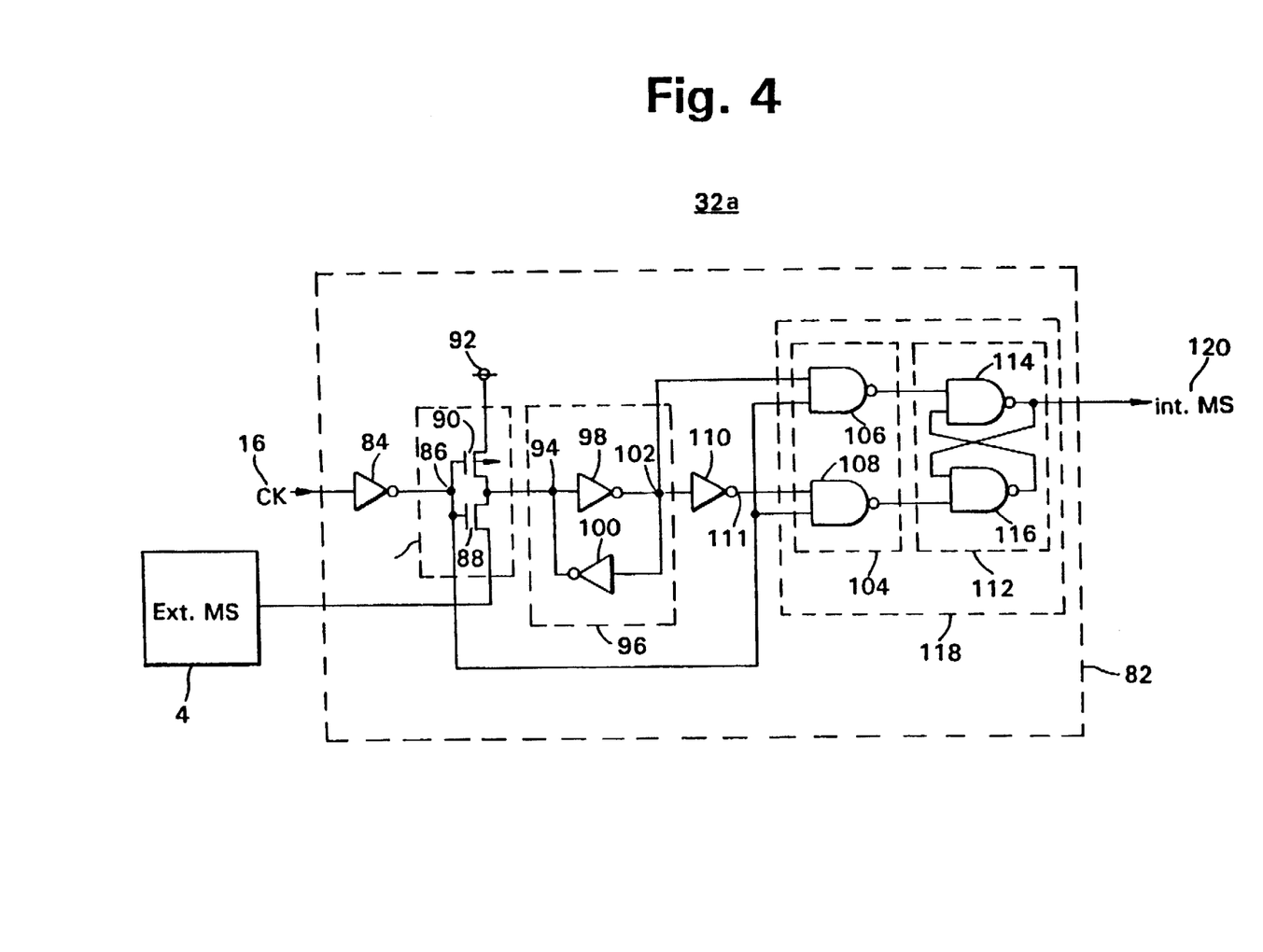
FIG. 4 is a circuit diagram of a mode setting circuit according to another embodiment of the present invention.

FIG. 4 illustrates another embodiment of a mode setting circuit 32a. The mode setting circuit 32a includes a mode setting terminal 4 and a function select signal generating circuit 82 to output an int. MS signal 120. This embodiment differs from the previous embodiment in that the potential of the Ext. MS signal is a ground potential Vss, whereas, a supply potential Vcc was applied in the previous embodiment. For generating a clock input signal CK, the clock signal generating circuit of FIG. 2 is also preferably used.

Figure 5:
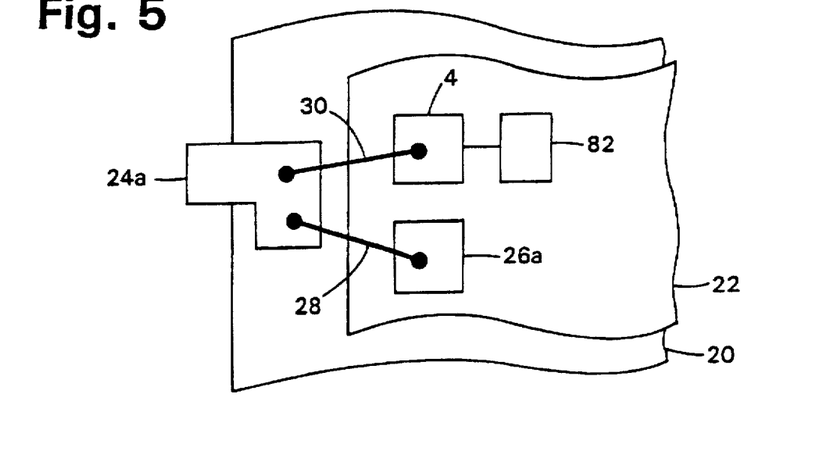
FIG. 5 shows a partial structure of a semiconductor apparatus incorporating the mode setting circuit according to the invention.

FIG. 5 illustrates a partial structure of a mode setting apparatus including the mode setting circuit 32a. A package 20 accommodates a semiconductor integrated circuit device 22 with a mode setting terminal 4, a function select signal generating circuit 82 and a ground potential Vss terminal 26a. A ground potential Vss pin 24a is formed on the package 20, and is connected to ground potential Vss terminal 26a and the terminal 4 by metal wires 28 and 30, respectively. Accordingly, the terminal 4 has a potential which is substantially equivalent to that of the ground potential Vss terminal 24a.

The mode setting circuit and apparatus shown in FIGS. 4 and 5 operate as follows. In FIG. 4, the clock input signal CK 16 is inputted to the inverter circuit 84. The output signal of the inverter circuit 84 at a control terminal 86 is inputted to a switching circuit 88, e.g., a n-channel MOSFET, and to a reset circuit 90, a p-channel MOSFET. The source of the n-channel MOSFET 88 is connected to the mode setting terminal 4 to receive the Ext. MS signal, while the source of the p-channel MOSFET 90 is connected to a supply potential Vcc 92.

Further, the drains of the n-channel MOSFET 88 and the p-channel MOSFET 90 are connected to each other, and a potential at the drains is supplied, at a node 94, to a first latch circuit 96 of a next stage constituted by inverter circuits 98 and 100. The signal at a node 102 becomes an input signal of an inverter circuit 100, and an output signal of the inverter circuit 100 becomes an input signal to an inverter circuit 98. Hence, the foregoing input signal is temporarily held until there is a change in the input signal to the inverter circuit 98.

The output signal of the first latch circuit 96, i.e., the potential at the node 102, is an input signal of a NAND gate 106 of a gate means section 104 having NAND gates 106 and 108. The other input signal of the NAND gate 196 is an input potential applied to the gates of the transistors 88 and 90. Further, the input signal of the NAND gate 108 is the input signal of the switching transistors 88 and 90 and a signal obtained by inverting the output signal of the first latch circuit 96 via an inverter circuit 110.

The output signal of the NAND gate 106 is inputted to the NAND gate 114 of a latch means 112 having NAND gates 114 and 116. The output signal of the NAND gate 114 is inputted to the NAND gate 116. The output signal of the NAND gate 116 is inputted to the NAND gate 114 as the other input signal, and the output signal of the NAND gate 114 is inputted to the NAND gate 116 as the other input signal. Similar to the previous embodiment, the combination of the gate means 104 and the latch means section 112 serve as a second latch circuit 118. The output signal of the NAND gate 114 is supplied to a subsequent stage as an output signal of the function select signal generating circuit 82, which is the int. MS signal of the mode setting circuit 32a.

Generally, in order to initialize a circuit which controls an operation of a semiconductor device, e.g., a dynamic random access memory (DRAM) and the like, the /RAS signal 76 is caused to be at a low "L" potential plural times during the dummy cycles after application of the supply potential, but before entering the normal operation cycles. This causes the first and second latch circuits 96 and 118 to be set in a holding state. An operation of the mode setting circuit 32a of this embodiment shown in FIG. 4 will be described with reference to the timing chart of FIG. 3.

When the /RAS signal 31 is at a high potential and the output signal of the clock input signal generating circuit CK 16 is at a high potential, the output signal from the inverter circuit 84 is inverted to a low potential. This signal is supplied to a gate of the n-channel MOSFET 88 and a gate of the p-channel MOSFET 90, and the p-channel MOSFET 90 becomes conductive. Hence, the supply potential Vcc 92 is applied to a subsequent stage through the node 94, and the first latch circuit 96 receives a high potential as an input signal and temporarily holds this signal.

The NAND gate 106 of the gate means 104, which also includes NAND gate 108, is supplied with a low potential input signal of the gates of the MOSFETs 88 and 90, and the low potential output signal from the first latch circuit 96. The NAND gate 108 receives the low output potential signal applied to the gates of the MOSFETs 88 and 90, and the high potential signal from the node 111, which is obtained by inverting the output signal of the first latch circuit 96 via the inverter circuit 110. Hence, the output signals of both the NAND gates 106 and 108 change to high potentials.

The output signals of the NAND gates 106 and 108 are inputted to the NAND gates 114 and 116, respectively, of the latch means 112. Since an output signal of the NAND gate 114 is inputted to the NAND gate 116 and an output signal of the NAND gate 116 is inputted to the NAND gate 114, the latch means 112 is set to a holding state. Hence, the signal held by the latch means 112 before the /RAS signal 76 changes to the high potential is maintained and outputted to the subsequent stage.

Similar to the previous embodiment, the circuit operation differs depending on whether or not the terminal 4 formed on the semiconductor device 22 is connected to the ground potential Vss terminal 26a via the terminal 24a when the /RAS signal 76 is a low potential. If the terminal 4 is connected to the pin 24a in the package 20 via the metal wire 30 and the /RAS signal 76 is a low potential, the output signal of the inverter circuit 84 changes to a high potential such that the n-channel MOSFET 88 becomes conductive. The potential at the node 94 changes to a low potential. The output signal of the first latch circuit 96, i.e., the potential at the node 102 of the first latch circuit 96, changes to a high potential. Further, the output signals of the NAND gates 106 and 108 in the gate means 104 change to low and high potentials, respectively. Hence, the output signal of the NAND gate 114, i.e., int. MS signal 120 of the latch means 112, changes to a high potential.

If the terminal 4 is not connected to the ground potential Vss pin 24a and the /RAS signal 76 is a low potential, the clock input signal CK 36 is inverted via the inverter circuit 84 and then applied to the gates of the switching transistors 88 and the reset transistor 90. The n-channel MOSFET 88 becomes conductive. Since the source of the n-channel MOSFET 88 is at a floating potential, the output signal of the transistors 88 and 90 at the node 94 becomes a high potential. The signal at the node 102 becomes a low potential, and the signal at the node 111 becomes a high potential. Further, the output signals of the NAND gates 106 and 108 are high and low potentials, respectively. Hence, the output signal of the latch means 112 changes to a low potential. As described above, once the potential of the int. MS signal 120 is determined depending on whether or not the terminal 4 is connected to the ground potential Vss pin 24a, the int. MS signal 120 does not change even during the second and subsequent cycles of the dummy cycles and the normal operation cycles.

The steady-state current through the switching circuit 88 and the reset circuit 90 can be fully suppressed even when the terminal 4 is connected to the ground potential Vss pin 24a. Since the two transistors 88 and 90 having alternate conductivity type are provided between the bonding pad 4 and the supply potential Vcc 92, only one of the transistors can be set to the conductive state. Hence, the power consumption is reduced.

In the foregoing embodiments, the dummy cycles are produced using the /RAS signal 76 and the subsequent clock signal CK, as shown in FIG. 3, before the mode setting circuit 32 or 32a enters the normal operation cycles. The dummy cycles set the latch circuits 96 and 118 of the function select signal generating circuit 32a in a holding state. If the dummy cycles are not generated at all when the mode setting circuit 32 or 32a is activated, the signal held in the circuit 32 or 32a becomes unstable, which may cause a temporary failure of the circuit operation.

Figure 6:
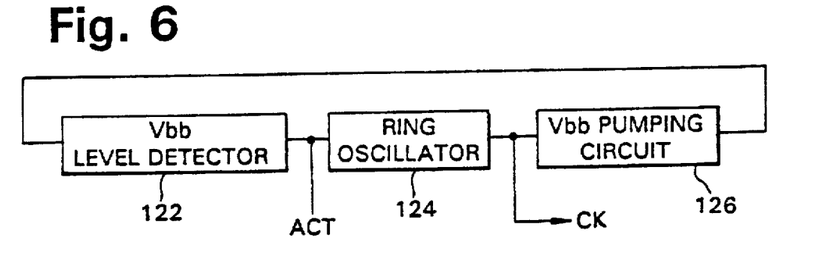
FIG. 6 illustrates a block diagram of a negative voltage and clock signal generator used to generate dummy clock signals for the mode setting circuit of the present invention.
Figure 7:
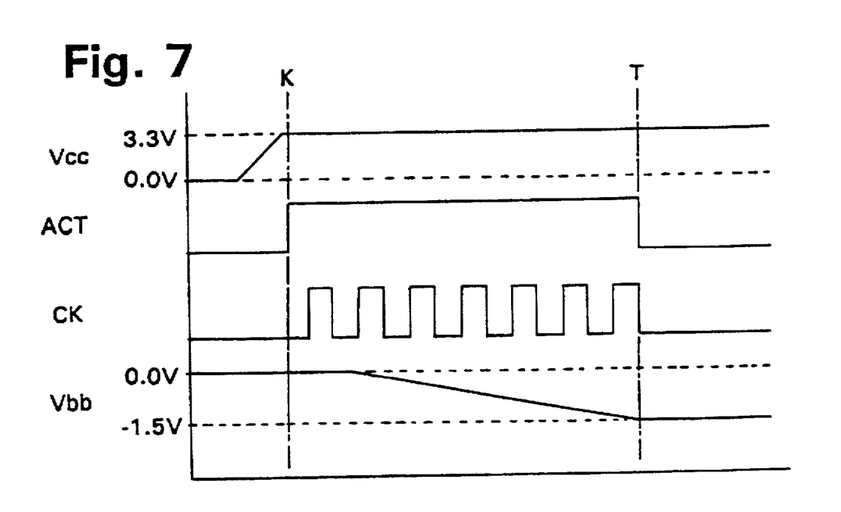
FIG. 7 shows a timing chart of the signals and voltages in the negative voltage and clock signal generator of FIG. 6.

A block diagram of a dummy cycle generating circuit is shown in FIG. 6, and a timing chart of this circuit is shown in FIG. 7. This circuit generates the dummy cycles in response to an application of the power supply voltage. Normally, in the semiconductor device, a potential of the p-type semiconductor substrate is biased to a negative potential for diminishing a junction capacitance between the p-type semiconductor substrate and the source/drain of the n-channel MOSFETs formed on the semiconductor substrate. The negative potential can be produced by a conventional negative voltage generating circuit described, for example, in an Unexamined Patent Publication No. 3-214669.

As shown in FIG. 7, the supply potential Vcc gradually increases from a 0.0 volts (V) to reach a given potential 3.3 V when the power supply voltage is applied. Immediately after the supply potential Vcc is applied (point K), the substrate potential Vbb is still substantially 0 V. The Vbb level detector 122 in FIG. 6 detects the potential Vbb and produces an output signal ACT of a high potential. In response to the high potential output signal ACT, the ring oscillator 124 produces clock signals CK until the output signal ACT changes to a low potential, which occurs when the substrate potential Vbb decreases to a predetermined potential of −1.5 V by a Vbb pumping circuit 126 (point K to point T). The vbb pumping circuit 126 generates the substrate potential Vbb and supplies the substrate potential Vbb to the Vbb level detector 122.

A clock signal is outputted from the ring oscillator 124. The clock signal produced during a time period after the supply potential Vcc reaches the given potential and until the substrate potential Vbb reaches the predetermined potential can be used as the clock input signal CK to the mode setting circuit of the present invention. Hence, the mode setting circuit operates stably, and operates with reduced power consumption.

Figure 8:
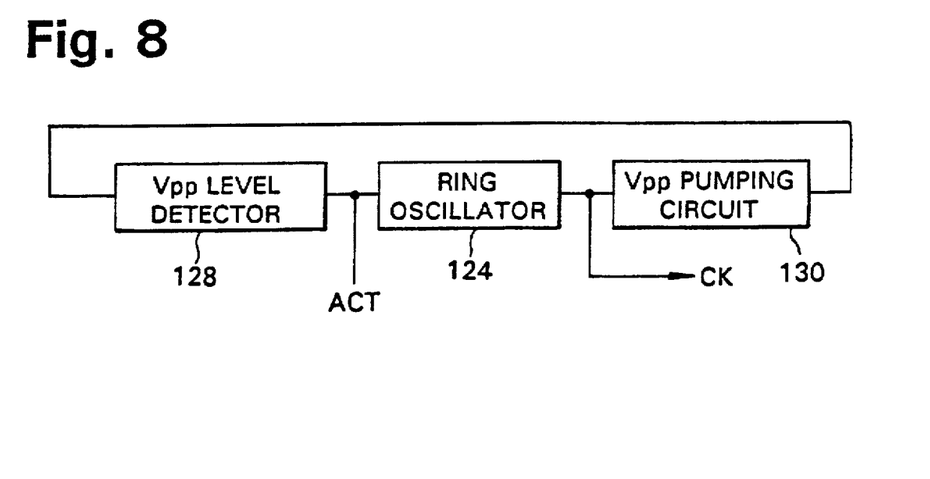
FIG. 8 illustrates a block diagram of an internally increased voltage and clock signal generator used to generate dummy clock signals for the mode setting circuit of the present invention.
Figure 9:
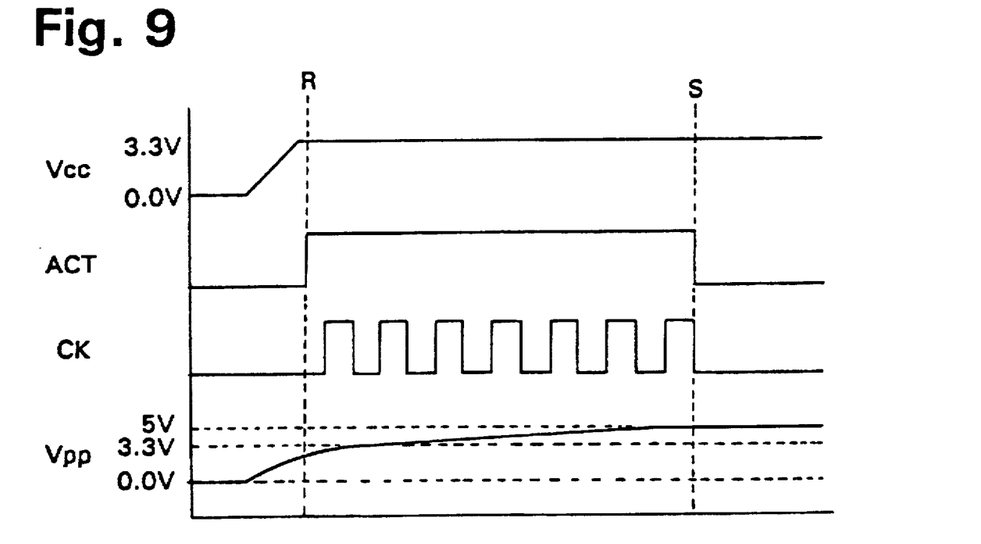
FIG. 9 shows a timing chart of the signals and voltages in the voltage and clock signal generator of FIG. 8.

Another embodiment of a dummy cycle generating circuit is illustrated in FIGS. 8 and 9. Normally, in the semiconductor memory, a potential of the word line is required to be at a high potential for writing or erasing data into or from the memory cells. For this purpose, the supply potential Vcc is further increased to produce the high potential. Using an internal increased potential Vpp from the supply potential Vcc, the dummy cycles can be generated. The circuit of FIG. 8 represents in block diagram a conventional internal increased potential generating circuit shown in FIG. 68 of an Unexamined Patent Publication No. 3-214669.

When the power supply Vcc is first applied, the supply potential Vcc gradually increases from 0.0 V to reach a driving potential of 3.3 V, as shown in FIG. 9. The potential Vcc is detected by a Vpp level detector 128. Immediately after the supply potential Vcc is applied (point R), the internal increased potential Vpp has not yet reached a predetermined potential of 5 V. In response to this internal increased potential Vpp, the Vpp level detector 128 changes the output signal ACT from a low potential to a high potential. During the period from point R to point S, the internal increased potential is increased to the predetermined potential of 5 V by the Vpp pumping circuit 130. In response to the high potential of the output signal ACT, the ring oscillator 124 produces the clock signal CK until the output signal ACT changes to a low potential, i.e., until the predetermined potential of 5 V is reached at point S. The clock signal CK of the ring oscillator is applied to the mode generating circuit as dummy clock signals such that the mode setting circuit of the present invention stably-operates with reduced power consumption.

The foregoing embodiment is merely exemplary and not to be construed as limiting the basic concept of mode setting circuit. Moreover, while semiconductor devices have been exemplified, the invention is not so limited, and can easily be applied to other devices requiring a circuit to select one of the multiple functions of the devices.

I claim:

1. A mode setting circuit comprising:

a mode setting terminal to receive a mode setting potential;

a switching circuit connected to said mode setting terminal;

a first holding circuit supplied with the mode setting potential from said mode setting terminal via said switching circuit;

a reset circuit connected to said first holding circuit for resetting said first holding circuit;

a control signal terminal supplying a control signal for controlling said switching circuit and said reset circuit; and a second holding circuit connected to said first holding circuit and receiving a signal from said first holding circuit to produce and hold an output signal, said second holding circuit, when said first holding circuit is reset by said reset circuit, holding a state it was in prior to the reset of said first holding circuit, said first holding circuit being set to a state corresponding to a state of said mode setting potential when said control signal has a first state in which said first holding circuit is conductively connected to said mode setting terminal via said switching circuit with said second holding circuit being set to a holding state to produce and hold an output signal corresponding to the state of the mode setting potential, and said second holding circuit being set to continue the holding state when said control signal has a second state in which said first holding circuit is reset by said reset circuit.

2. The mode setting circuit as set forth in claim 1, wherein said switching circuit and said reset circuit are connected in series between said mode setting potential and a reference potential and arranged such that when one of said switching and reset circuits is set to a conductive state, the other of said switching and reset circuits is set to a non-conductive state.

3. The mode setting circuit as set forth in claim 1, wherein said control signal is in the form of a clock signal which causes said switching circuit and said reset circuit to be set to a conductive state and a non-conductive state alternately with respect to each other.

4. The mode setting circuit as set forth in claim 1, wherein said switching circuit includes a first switching element having a source connected to said mode setting terminal and a gate supplied with said control signal, said reset circuit including a second switching element having a source connected to a ground potential terminal and a gate supplied with said control signal, and drains of said first and second switching elements are connected to each other for outputting a signal.

5. The mode setting circuit as set forth in claim 4, wherein said mode setting terminal is selectively set either to a state where said mode setting terminal is connected to a supply potential or a state where said mode setting terminal is disconnected from said supply potential.

6. The mode setting circuit as set forth in claim 4, wherein said first and second switching elements are MOS transistors having complimentary conductive types.

7. The mode setting circuit as set forth in claim 1, wherein said switching circuit includes a first switching element having a source connected to the mode setting terminal and a gate supplied with the control signal, said reset circuit including a second switching element having a source connected to a supply potential terminal and a gate supplied with the control signal, and said first and second switching elements have drains connected to each other for outputting a signal.

8. The mode setting circuit as set forth in claim 7, wherein said mode setting terminal is selectively set either to a state where said mode setting terminal is connected to a ground potential or to a state where said mode setting terminal is disconnected from said ground potential.

9. The mode setting circuit as set forth in claim 7, wherein said first and second switching elements are MOS transistors having complimentary conductive types.

10. The mode setting circuit as set forth in claim 1, wherein said second holding circuit produces the output signal in response to a combination of a signal corresponding to said control signal and signals from said first holding circuit.

11. The mode setting circuit as set forth in claim 1, wherein said second holding circuit includes a gate means section and a holding means section, said gate means section receiving a signal corresponding to said control signal and signals from said first holding circuit and supplying its output to said holding means section, said holding means section producing and holding an output signal.

12. The mode setting circuit as set forth in claim 1, wherein said second holding circuit receives a signal corresponding to the control signal, an output signal of said first holding circuit and an inverted signal of said output signal of the first holding circuit to produce the output signal.

13. The mode setting circuit as set forth in claim 1, wherein said first holding circuit outputs an output signal obtained by inverting an input signal thereto, and said second holding circuit receives a signal corresponding to said control signal, and said input and output signal of said first holding circuit to produce the output signal.

14. A mode setting circuit comprising:

a mode setting terminal to receive a mode setting potential;

a switching circuit connected to said mode setting terminal;

a first holding circuit supplied with the mode setting potential from said mode setting terminal via said switching circuit;

a reset circuit connected to said first holding circuit for resetting said first holding circuit;

a control signal terminal supplying a control signal for controlling said switching circuit and said reset circuit; and a second holding circuit connected to said first holding circuit and receiving a signal from said first holding circuit to produce and hold an output signal, wherein when said control signal has a first state in which said first holding circuit is conductively connected to said mode setting terminal via said switching circuit, said first holding circuit is set to a state corresponding to a state of said mode setting potential, said second holding circuit is set to a holding state to produce and hold an output signal corresponding to the state of the mode setting potential, and when said control signal has a second state in which said first holding circuit is reset by said reset circuit, and said second holding circuit is set to continue the holding state;

and further comprising a clock signal generating circuit for generating a clock signal to be used as said control signal, said clock signal generating circuit including a level detector monitoring a substrate potential and generating an output signal indicative of a magnitude of the substrate potential, a ring oscillator supplied with the output signal of said level detector and generating an output signal including said clock signal based on the output signal of said level detector, and a pumping circuit supplied with the output signal of said ring oscillator, and negatively increasing said substrate potential, wherein the output signal of said ring oscillator is used as said clock signal.

15. A mode setting circuit comprising:

a mode setting terminal to receive a mode setting potential;

a switching circuit connected to said mode setting terminal;

a first holding circuit supplied with the mode setting potential from said mode setting terminal via said switching circuit;

a reset circuit connected to said first holding circuit for resetting said first holding circuit;

a control signal terminal supplying a control signal for controlling said switching circuit and said reset circuit; and a second holding circuit connected to said first holding circuit and receiving a signal from said first holding circuit to produce and hold an output signal, wherein when said control signal has a first state in which said first holding circuit is conductively connected to said mode setting terminal via said switching circuit, said first holding circuit is set to a state corresponding to a state of said mode setting potential, said second holding circuit is set to a holding state to produce and hold an output signal corresponding to the state of the mode setting potential, and when said control signal has a second state in which said first holding circuit is reset by said reset circuit, and said second holding circuit is set to continue the holding state;

and further comprising a clock signal generating circuit for generating a clock signal to be used as said control signal, said clock signal generating circuit including a level detector monitoring an internal increased potential and generating a signal indicative of a magnitude of the internal increased potential, a ring oscillator supplied with the output signal of said level detector and generating an output signal including said clock signal based on the inputted signal, and a pumping circuit supplied with the output signal of said ring oscillator and generating an internal increased potential, wherein the output signal of said ring oscillator is used as said control signal.

16. A semiconductor apparatus comprising:

a) a package;

b) a potential terminal provided on said package; and c) a semiconductor device having a mode setting circuit mounted on said package, said mode setting circuit including i) a mode setting terminal to receive a mode setting potential, ii) a switching circuit connected to said mode setting terminal, iii) a first holding circuit supplied with the mode setting potential from said mode setting terminal via said switching circuit, iv) a reset circuit connected to said first holding circuit for resetting said first holding circuit, v) a control signal terminal supplying a control signal for controlling said switching circuit and said reset circuit, and vi) a second holding circuit connected to said first holding circuit and receiving a signal from said first holding circuit to produce and hold an output signal, said second holding circuit, when said first holding circuit is reset by said reset circuit, holding a state it was in prior to the reset of said first holding circuit, said first holding circuit being set at a state corresponding to a state of said mode setting potential when said control signal has a first state in which said first holding circuit is conductively connected to said mode setting terminal via said switching circuit with said second holding circuit being set to a holding state to produce and hold an output signal corresponding to the state of the mode setting potential, and said second holding circuit being set to continue the holding state when said control signal has a second state in which said first holding circuit is reset by said reset circuit.

17. The semiconductor apparatus of claim 16, wherein said mode setting terminal of said mode setting circuit is selectively connected to the potential terminal or disconnected from said potential terminal.

18. The semiconductor apparatus of claim 16, wherein a supply potential is provided to said potential terminal.

19. The semiconductor apparatus of claim 16, wherein a ground potential is provided to said potential terminal.

20. An apparatus comprising:

a mode setting terminal;

a switching and resetting circuit receiving a signal from said mode setting terminal, said switching and resetting circuit including
a first transistor having a control electrode and first and second electrodes, said first electrode being connected to said mode setting terminal, and said control electrode receiving a control signal, and
a second transistor having a control electrode and first and second electrodes, said first electrode being coupled to a predetermined potential, said second electrodes of the first and second transistor being connected to one another, and said control electrode of said second transistor receiving said control signal; and latch means for one of producing and holding an output signal in accordance with the control signal, said latch means including
a first holding circuit supplied with a potential applied at the mode setting terminal via said first transistor; and
a second holding circuit connected to said first holding circuit and receiving a signal from said first holding circuit to produce and hold said out-out signal, said resetting circuit resetting said first holding circuit and said second holding circuit holding a state it was in prior to resetting of said first holding circuit.

21. The apparatus of claim 20, wherein a potential applied to said mode setting terminal is one of a supply potential, a ground potential and a floating potential.

22. The apparatus of claim 20, wherein said predetermined potential is one of a supply potential and a ground potential.

23. The apparatus of claim 20, wherein when said control signal has a first state in which said first holding circuit is conductively connected to said mode setting terminal via said first transistor, said first holding means is set at a state corresponding to a state of said mode setting potential, and said second holding circuit is set to a holding state to produce and hold an output signal corresponding to the state of the mode setting potential, and when said control signal has a second state in which said first holding circuit is reset by said second transistor, and said second holding circuit is set to continue the holding state.

24. The apparatus of claim 20, wherein said first and second transistors are set to a conductive state and a non-conductive state alternately with respect to each other based on said control signal.

25. A mode setting circuit comprising:

a clock signal input node receiving a clock signal;

a first inverter receiving the clock signal and providing an output to a second inverter;

a mode setting terminal receiving a mode setting potential;

a switching circuit including first and second transistors each having a source, drain and gate, the source of the first transistor being connected to the mode setting terminal, the source of said second transistor being connected to ground, the drains of the first and second transistors being connected to each other, and the gates of the first and second transistors each receiving an output from the second inverter;

a first holding circuit having an input and an output, the input supplied with an output potential from the drains of the first and second transistors; and a second holding circuit connected to said first holding circuit and receiving a signal from said first holding circuit to produce and hold an output signal, said second holding circuit including a gate section having first and second NAND gates and a latch section having third and fourth NAND gates, said first NAND gate having an input connected to the input of the first holding circuit and said second NAND gate having an input connected to the output of the first holding circuit, an output of said second inverter being connected to another input of each of said first and second NAND gates, the third NAND gate receiving as inputs the output of the first NAND gate and an output of the fourth NAND gate, and the fourth NAND gate receiving as inputs the output of the second NAND gate and an output of the third NAND gate, the output of the third NAND gate also being an output signal of the mode setting circuit.

26. A mode setting circuit comprising:

a clock signal input node receiving a clock signal;

a first inverter receiving the clock signal and providing an output;

a mode setting terminal receiving a mode setting potential;

a switching circuit including first and second transistors each having a source, drain and gate, the source of the first transistor being connected to a power supply potential, the source of said second transistor being connected to the mode setting terminal, the drains of the first and second transistors being connected to each other, and the gates of the first and second transistors each receiving the output from the first inverter;

a first holding circuit having an input and an output, the input supplied with an output potential from the drains of the first and second transistors; and a second holding circuit connected to said first holding circuit and receiving a signal from said first holding circuit to produce and hold an output signal, said second holding circuit including a gate section having first and second NAND gates and a latch section having third and fourth NAND gates, said first NAND gate having an input connected to the output of the first holding circuit and said second NAND gate having an input connected to the output of the first holding circuit via a second inverter, an output of said first inverter being connected to another input of each of said first and second NAND gates, the third NAND gate receiving as inputs the output of the first NAND gate and an output of the fourth NAND gate, and the fourth NAND gate receiving as inputs the output of the second NAND gate and an output of the third NAND gate, the output of the third NAND gate also being an output signal of the mode setting circuit.

* * * * *